United States Patent [19]
Naya

[11] Patent Number: 5,265,110
[45] Date of Patent: Nov. 23, 1993

[54] NON-LINEAR OPTICAL EFFECT FREQUENCY CONVERSION LASER

[75] Inventor: Masayuki Naya, Shizuoka, Japan

[73] Assignee: Fuji Photo Film Co., Ltd., Kanagawa, Japan

[21] Appl. No.: 883,193

[22] Filed: May 14, 1992

[30] Foreign Application Priority Data

May 15, 1991 [JP] Japan .................................. 3-110117

[51] Int. Cl.$^5$ ............................................. H01S 3/10
[52] U.S. Cl. ........................................ 372/21; 372/22
[58] Field of Search .......................... 372/21, 22, 34, 32

[56] References Cited

U.S. PATENT DOCUMENTS

| | | | |
|---|---|---|---|
| 5,054,028 | 10/1991 | Esherick et al. | 372/32 |
| 5,077,748 | 12/1991 | Kozlovsky et al. | 372/32 |
| 5,111,468 | 5/1992 | Kozlovsky et al. | 372/32 |

OTHER PUBLICATIONS

Applied Physics Letters of American Institutes of Physics, vol. 56, No. 23, pp. 2291-2292, Jun. 4, 1990 "Generation of 41 mW of Blue Radiation by Frequency Doubling of a GaAlAs Diode Laser", Kozlovsky et al.

Primary Examiner—Rodney B. Bovernick
Assistant Examiner—Robert E. Wise
Attorney, Agent, or Firm—Sughrue, Mion, Zinn, Macpeak & Seas

[57] ABSTRACT

A non-linear optical effect frequency conversion laser of the present invention which can stabilize the oscillation frequency thereof, and which can convert the frequency of laser light emitted by a laser light source using a ring resonator composed of a non-linear optical element comprises a thermoelectric conversion device provided for the laser light source to maintain a predetermined temperature thereof, a temperature sensor also provided for the laser light source to measure the temperature thereof, a comparator for comparing a detection signal in response to the temperature of the laser light source outputted from the temperature sensor with a reference voltage signal in response to a predetermined temperature, and a driver means in response to the differential voltage signal outputted from the comparator for driving the thermoelectric conversion device as a cooling device for the purpose of stabilizing the oscillation of the laser light source.

5 Claims, 2 Drawing Sheets

NON-LINEAR OPTICAL EFFECT FREQUENCY CONVERSION LASER

BACKGROUND OF THE INVENTION

The present invention relates to a non-linear optical effect frequency conversion laser, and more particularly, to a non-linear optical effect frequency conversion laser which uses a ring resonator.

There has been known technology which uses a non-linear optical effect by allowing the laser light to enter a non-linear medium to generate higher harmonics. For instance, the light of the frequency of $2\omega$ can be achieved simply by making the laser light having the frequency of $\omega$ to enter a second-order non-linear medium suitable for the generation of second harmonics (SHG) which is not symmetrical about the center thereof. Therefore, the non-linear medium is frequently used as a frequency conversion element for converting a frequency to a higher one (or a wavelength to a shorter one). A requirement for a high-efficiency SHG is phase matching that is achieved when the non-linear medium exhibits birefringence, and furthermore, crystal orientation and polarization layout by which the refractive index of a second harmonic is coincident with that of a fundamental harmonic are existent in the medium. Examples of the second-order non-linear material (SHG element) capable of phase matching include $KH_2PO_4$(KDP), $LiNbO_3$, $KNbO_3$, KTP, $Ag_3AsS_3$, and $CO(NH_2)_2$(UREA). However, when light having a predetermined frequency is taken out simply by causing the laser light to enter the SHG element for second harmonic generation, output efficiency is low.

To overcome this low output efficiency, non-linear optical frequency conversion technology which uses a monolithic ring resonator made of $KNbO_3$ as a second-order non-linear material to generate second harmonics has been proposed. The bulletin Vol.56 No.23 of the American Applied Physics Society published on Jun. 4, 1990 discloses on p.2291–2292 a second order optical frequency convertor which comprises a diode laser 11, a lens 13, a pair of prisms 14, an isolator 15, a lens 17, an SHG element 19, a photo detector 21 for detecting light reflected from the SHG element 19, an RF (radio frequency) amplifier 23 for amplifying a detection signal from the photo detector 21, a double-balanced mixer 25, an RF (radio frequency) signal generator 27 for generating an RF (radio frequency) signal to input the RF signal into the double-balanced mixer 25 and to mix the control signal of the diode laser 11 and the RF signal through a filter 29, an amplifier 32 for amplifying a heterodyne signal from the double-balanced mixer 25 for feedback output to the diode laser 11, and a DC (direct current) power supply 33 for adding a DC bias element to the output of the amplifier.

In this device, laser light having a wavelength of 856 nm, for example, from a GaAlAs diode laser is inputted into one end of the monolithic ring resonator made of $KNbO_3$ to output laser light having a wavelength of 428 nm, namely blue laser light, from the other end of this resonator. For such non-linear optical frequency conversion, the oscillation frequency of the diode laser needs to substantially accord with the resonance frequency of the ring resonator. In this example, the frequency of the diode laser fluctuates up to 2 GHz/mA by current variations and up to 40 GHz/° C. by temperature variations. The temperature variations are caused by thermal variations due to: (1) changes in ambient temperature, and (2) a self-heating phenomenon optically induced by the diode laser itself. Therefore, this leads to variations in the output of infrared light from the diode laser, which affect the output of blue laser light outputted from the ring resonator as a second harmonic.

Therefore, so as to generate a second harmonic from a ring resonator stably, this embodiment discloses as an essential element of this non-linear optical frequency convertor, means for keeping the oscillation frequency of a diode laser constant in the following steps: (1) superimposing a reference low frequency on the sideband of the laser oscillation frequency, (2) reflecting part of the laser light containing the low frequency component with one end of the resonator, (3) detecting the reflected light with the photo detector, (4) detecting the state of resonance of the ring resonator from the signal of the reflected light, and (5) feed-back controlling of the oscillation of the diode laser based on the detected state of resonance.

However, in the conventional non-linear optical effect frequency conversion laser, frequencies are not stable in terms of long intervals. In spite of the temperature control of the non-linear optical crystals, the semiconductor laser generates heat after long-time use, thus changing crystal composition and oscillation frequency. In the conventional device, output fluctuates by the control of frequency because laser output and oscillation frequency are controlled simultaneously only with a current.

BRIEF SUMMARY OF THE INVENTION

In view of the problem with the prior art, it is an object of the present invention to provide a non-linear optical effect frequency conversion laser which can stabilize the oscillation frequency of a non-linear optical effect conversion laser.

To overcome the aforementioned problem, the present invention is to provide a non-linear optical effect frequency conversion laser capable of converting a frequency of laser light emitted by a semiconductor laser using a ring resonator, comprising:

a thermoelectric conversion device provided for said semiconductor laser to maintain a predetermined temperature thereof;

a temperature sensor provided for said semiconductor laser to measure a temperature thereof;

a comparator for comparing a detection signal corresponding to the temperature of said semiconductor laser from said temperature sensor with a signal corresponding to the sum of a reference voltage signal corresponding to the predetermined temperature and low frequency components of a heterodyne error signal from said ring resonator; and driving means for driving said thermoelectric conversion device in response to a differential voltage signal outputted from said comparator.

Preferably, said thermoelectric conversion device is composed of a Peltier element.

Preferably, said ring resonator is a monolithic ring resonator for generating a second harmonic.

Preferably, said monolithic ring resonator is composed of a non-linear optical crystal.

Preferably, said ring resonator is provided for a thermoelectric cooling device to control a temperature of the ring resonator.

DETAILED DESCRIPTION OF THE INVENTION

Figure 1:
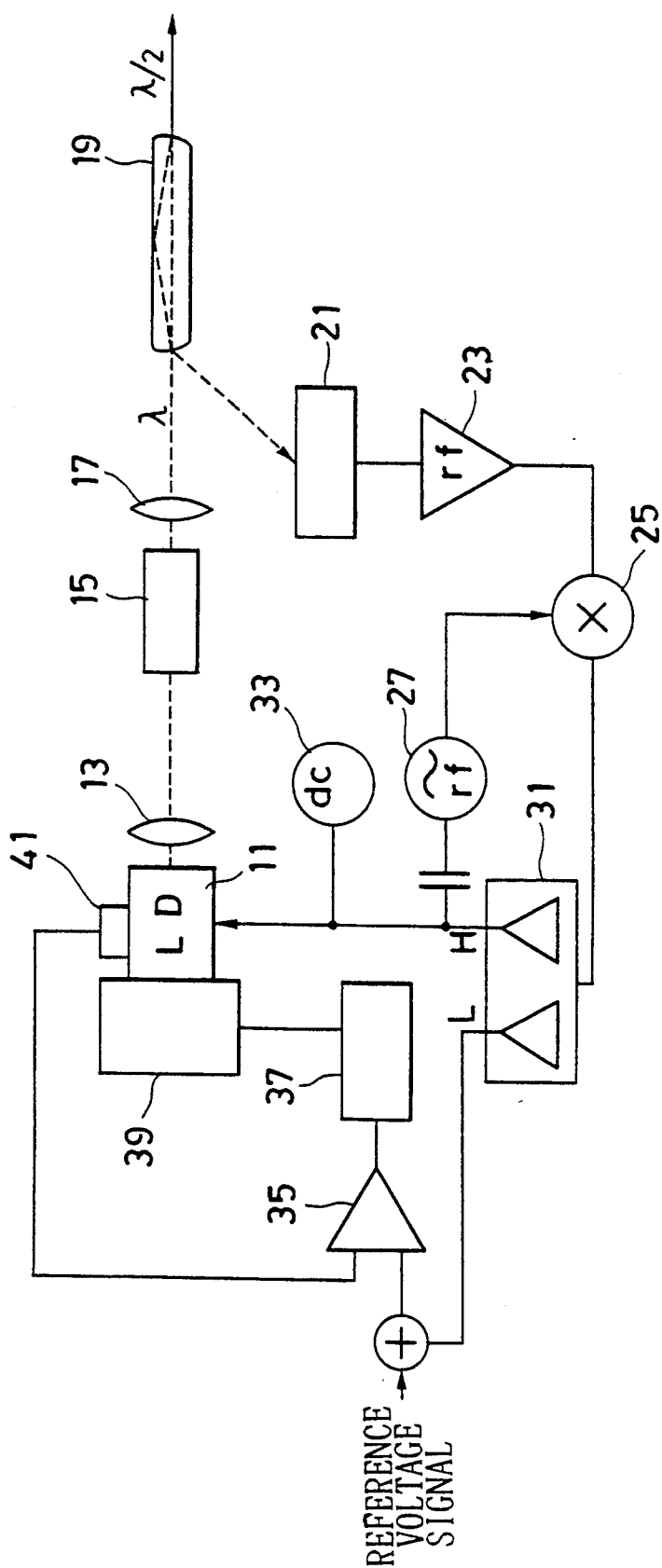
FIG. 1 is a schematic circuit diagram of an embodiment of a non-linear optical effect frequency conversion laser according to the present invention.
Figure 2:
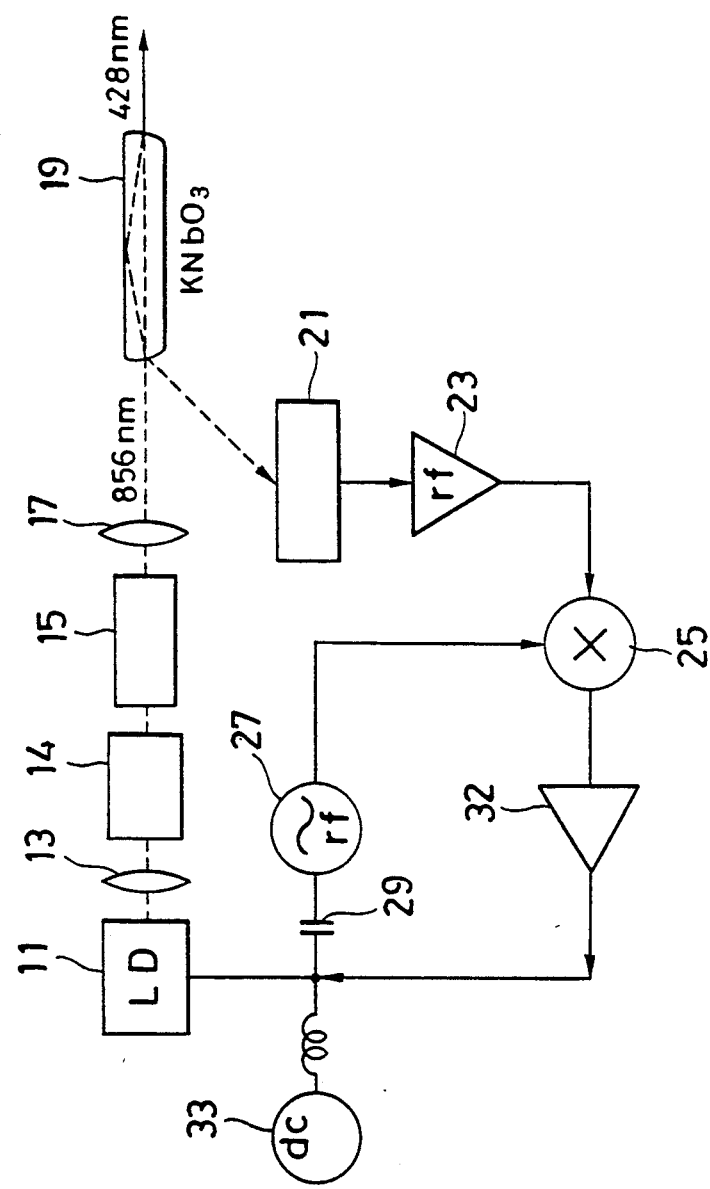
FIG. 2 is a schematic circuit diagram of a non-linear optical effect frequency conversion laser of the prior art.

The non-linear optical effect frequency conversion laser of the present invention is described hereinafter in more detail.

The principal object of the present invention is to control the temperature drift of the diode laser, attending to the fact that the frequency drift of the diode laser by the temperature drift thereof is about a maximum of 20 times compared with the frequency fluctuation of the semiconductor laser by the current fluctuation thereof.

Conventionally, a laser oscillator is controlled with a current in response to light reflected from the conventional SHG element. In addition to the prior art, in the present invention, a thermoelectric conversion device for keeping constant the temperature of a laser light source is provided to maintain a predetermined oscillation frequency. A detection signal from a temperature sensor provided on the laser light source is compared with a reference voltage signal by a comparator to achieve a differential voltage signal. Since a low frequency component of an error signal contained in light reflected by the SHG element is further added to the reference voltage signal, the temperature drift of the laser light source can be controlled. Thereafter, the differential voltage signal from the comparator is fed back to a driving means to maintain the thermoelectric conversion device at a predetermined temperature range, whereby the laser light source can be maintained at a predetermined temperature range in response to a predetermined temperature range of the thermoelectric conversion device.

With reference to the accompanying drawings, a stable oscillation circuit of a non-linear optical effect frequency conversion laser according to an embodiment of the present invention will be described in detail.

The laser of the present invention comprises a diode laser 11, a lens 13, an isolator 15, a lens 17, an SHG element 19, a photo detector 21 for detecting light reflected from the SHG element 19, an RF (radio frequency) amplifier 23 for amplifying a detection signal from the photo detector 21, a double-balanced mixer 25, an RF signal generator 27 for generating an RF (radio frequency) signal to input the RF signal into the double-balanced mixer 25 and to mix the RF signal through a filter 29 to the control signal of the diode laser, an amplifier 31 for amplifying high frequency and low frequency components separately to feed back the high frequency component H to the diode laser and output the low frequency component L to the comparator, a DC (direct current) power supply 33 for adding a DC bias component to the output of the high frequency component H of the amplifier, a comparator 35 having an input terminal into which the sum signal of the low frequency component L from the amplifier and the reference voltage signal is inputted, a driver means 37 into which the output of the comparator is inputted, a Peltier element 39 which functions as a cooling device controlled at a predetermined temperature range by the output of the driver means 37, and a temperature sensor 41 provided for the diode laser to measure the temperature thereof and input the detected output signal thereof into the other input terminal of the comparator.

Hereafter, there will be described an example of a non-linear optical effect frequency conversion laser in which a GaAlAs diode laser having an oscillation wavelength of 856 nm is used to input the laser light generated from this diode laser into a ring resonator made of $KNbO_3$ crystals and to generate the light having a wavelength of 428 nm using a heterodyne detection system in order to stably oscillate the diode laser 11 without being affected by the temperature fluctuations using a temperature control system.

The circuit described above has two feed-back circuits. A first feed-back circuit is mainly constituted by the photo detector 21 for detecting the reflected laser light, the RF amplifier 23, the mixer 25 and the amplifier 31, excluding the diode laser and the laser optics. This first feed-back circuit detects the laser light reflected from the ring resonator and extracts a high frequency component in response to fluctuations in the frequency of the laser light in order to control the diode laser 11 with a current based on the high frequency component and to keep the constant oscillation output and the constant oscillation frequency. A second feed-back circuit is mainly constituted by the temperature sensor 41, the amplifier 31, the comparator 35, the driver means 37 and the Peltier element 39. This second feed-back circuit extracts a low frequency component in response to the frequency drift of the diode laser caused by the long-time use (or the age changing) in order to control and keep the temperature of the diode laser 11 constant based on the low frequency component. Therefore, this circuit can prevent the oscillation frequency of the diode laser 11 from fluctuating by the temperature drift, and can keep the oscillation frequency constant.

The SHG element 19 is a monolithic ring resonator for generating a second harmonic which is prepared by polishing both ends of several-millimeter-long $KNbO_3$ crystals and attaching a curved mirror to both these ends so as to achieve a flat internal reflective surface parallel to the mirror axis. Crystal orientation is selected so that phase matching can be achieved for the SHG element in the longitudinal direction of the ring passage, whereby blue laser light is generated from the other end of the ring resonator. This monolithic $KNbO_3$ crystal resonator is mounted on a thermoelectric cooling device using a thermoelectric conversion device for temperature control so that a phase matched second harmonic can be outputted stably.

The diode laser 11 is not specifically limited, and any known element can be used if it is a single mode diode laser able to achieve high output. The temperature of the diode laser is controlled and an injection current is also controlled to synchronize the oscillation frequency of the diode laser with a predetermined frequency. Because of this, single-mode output can be obtained.

The lens 13 is a convergent lens having a predetermined focal length. A pair of prisms may be additionally provided after the lens. The isolator 15 is a Faraday type isolator which separates the laser light emitted by the diode laser so that the laser light is not reflected or scattered into the diode laser. A lens having a predetermined focal length is selected as the lens 17 so that it can conform to the reference mode of the ring resonator 19 for space mode matching.

The diode laser 11 needs to match the frequency thereof with the 200 MHz frequency band of a cavity resonator. As previously described in the section of "BACKGROUND OF THE INVENTION (Prior Art)", the frequency of this diode laser fluctuates up to 2 GHz/mA by current variations and up to 40 GHz/°C. by temperature variations. Thus the frequency of the diode laser is significantly changed by the temperature variations. The temperature variations are caused by thermal variations due to: (1) changes in ambient temperature, and (2) a self-heating phenomenon optically induced by the diode laser itself. Therefore, this leads to changes in the output of infrared light generated from the diode laser, which greatly affects the output of blue laser light outputted from the ring resonator 19 as a second harmonic The first feed-back circuit described in the foregoing is used to control the frequency of the laser light to be inputted into the ring resonator 19 so that the frequency of the laser light coincides with the resonance frequency of the ring resonator 19. For this technique, weak frequency-modulation (FM) sidebands are produced around the laser frequency by superimposing a small radio frequency (RF) current (325 MHz) from a radio frequency (RF) oscillator 27 on the DC injection current using the capacitive coupling of the condenser 29. An FM light spectrum thus formed impinges onto the resonator, and light having a heterodyne spectroscopy signal is reflected by the end surface of the resonator. This signal becomes zero when the carrier frequency coincides with the frequency of the cavity resonator. Therefore, an AC (alternating current) electric signal is obtained as a differential frequency between the signal light and a local oscillation light (a light of a semiconductor laser functioning as a local oscillator) through the light heterodyne detection by which the photo detector 21 detects the laser light reflected at the end surface of the resonator, and is amplified with the subsequent RF amplifier 23. The double-balanced mixer 25 is used to detect the phase of the light heterodyne spectroscopy signal of light reflected by the end surface of the resonator. The output of the double-balanced mixer 25 is inputted into the amplifier 31 which then divides it into the high frequency component H and the low frequency component L by such means as a filter. The high frequency component H is amplified and is combined with the capacitively coupled signal from the RF oscillator 27 and the laser injection current from the DC power supply 33 for supply to the diode laser 11.

In the second feed-back circuit, the low frequency component L of the light heterodyne spectroscopy signal is separated and amplified for output to the comparator 35. A reference voltage for setting the predetermined temperature is added to the signal of the low frequency component L from the amplifier 31 for input into one input terminal of the comparator 35. A detection signal in response to the surface temperature of the diode laser 11 from the temperature sensor 41 is inputted into the other input terminal of the comparator 35. At the comparator, a differential voltage between these two inputs is achieved and outputted from an output terminal thereof. The differential voltage signal outputted from the comparator 35 is inputted into the driver means 37 to generate the control signal for output to the Peltier element 39. With this second feed-back circuit, the Peltier element 39 is maintained at a predetermined temperature (different by type of diode laser) which enables the diode laser 11 to generate the infrared light having a wavelength of 856 nm or at a predetermined temperature range which enables the diode laser to generate the infrared light having a wavelength of 856 nm stably.

The Peltier element is used as a thermoelectric conversion device in this embodiment, but other thermoelectric conversion elements and other thermoelectric conversion devices can be used. A thermoelectric conversion device and a PID temperature control circuit are used together for the stabilization of the oscillation frequency and the output of a semiconductor diode laser at constant temperatures.

It is understood that the foregoing description is a preferred embodiment of the present invention and that various changes and modifications may be made in the invention without departing from the spirit and scope thereof.

According to the present invention, the thermoelectric conversion device is provided to maintain the predetermined temperature and the predetermined oscillation frequency of the laser light source, and the differential voltage signal is achieved by comparing the detection signal from the temperature sensor disposed on the laser light source and the reference voltage signal with the comparator. Since the low frequency component of an error signal contained in the laser light reflected from the SHG element is further added to the reference voltage signal, feed-back control can be performed according to the temperature drift of the laser light source. Therefore, the stable frequency and high output of the laser light source are ensured, and high output of the second harmonic generated from the ring resonator which receives the laser light from the laser light source can be obtained.

What is claimed is:

1. A non-linear optical effect frequency conversion laser capable of converting a frequency of laser light emitted by a semiconductor laser using a ring resonator, comprising:
   a first feedback circuit for controlling the injection current of the semiconductor laser and keeping an oscillation output and an oscillation frequency of the semiconductor laser constant, and which comprises:
      a photo detector for detecting reflected laser light reflected at one end of the ring resonator by light heterodyne detection;
      an amplifier containing a filter through which a heterodyne error signal detected by the photodetector is divided into a high frequency component in response to fluctuations in the frequency of the laser light derived from current variations of the semiconductor laser and a low frequency component in response to the frequency drift of the laser light derived from temperature drift of the semiconductor laser caused by long-time use or aging, and being capable of amplifying the high frequency component and the low frequency component;
      a DC power supply for supplying to the semiconductor laser a laser DC injection current on which the high frequency component of the heterodyne error signal produced by the amplifier is superimposed; and
      a radio frequency oscillator for producing a radio frequency signal superimposed on the laser DC injection current using capacitive coupling; and a second feedback circuit for preventing the oscillation frequency of the semiconductor laser from fluctuating due to temperature drift and keeping the oscillation frequency constant, and which comprises:
- a thermoelectric conversion device provided for said semiconductor laser to maintain a predetermined temperature thereof;
- a temperature sensor provided for said semiconductor laser to measure a temperature thereof;
- a comparator for comparing a detection signal corresponding to the temperature of said semiconductor laser from said temperature sensor with a signal corresponding to the sum of a reference voltage signal corresponding to predetermined temperature and low frequency components of the heterodyne error signal outputted from said amplifier; and
- driving means for driving said thermoelectric conversion device in response to a differential voltage signal outputted from said comparator.

2. A non-linear optical effect frequency conversion laser according to claim 1, wherein said thermoelectric conversion device is comprises of a Peltier element.

3. A non-linear optical effect frequency conversion laser according to claim 1, wherein said ring resonator is a monolithic ring resonator for generating a second harmonic.

4. A non-linear optical effect frequency conversion laser according to claim 3, wherein said monolithic ring resonator is composed of a non-linear optical crystal.

5. A non-linear optical effect frequency conversion laser according to claim 1, wherein said ring resonator is provided for a thermoelectric cooling device to control a temperature of the ring resonator

* * * * *